US009928867B2

(12) United States Patent
Xiao et al.

(10) Patent No.: US 9,928,867 B2
(45) Date of Patent: *Mar. 27, 2018

(54) TEMPLATES FOR PATTERNED MEDIA

(71) Applicant: Seagate Technology LLC, Cupertino, CA (US)

(72) Inventors: Shuaigang Xiao, Fremont, CA (US); XiaoMin Yang, Livermore, CA (US); ZhaoNing Yu, Palo Alto, CA (US); Yautzong Hsu, Fremont, CA (US)

(73) Assignee: Seagate Technology LLC, Cupertino, CA (US)

( * ) Notice: Subject to any disclaimer, the term of this patent is extended or adjusted under 35 U.S.C. 154(b) by 239 days.

This patent is subject to a terminal disclaimer.

(21) Appl. No.: 14/728,908

(22) Filed: Jun. 2, 2015

(65) Prior Publication Data
US 2015/0262606 A1 Sep. 17, 2015

Related U.S. Application Data

(63) Continuation-in-part of application No. 13/798,087, filed on Mar. 13, 2013, now Pat. No. 9,079,216, which is a continuation-in-part of application No. 13/018,416, filed on Jan. 31, 2011, now abandoned.

(60) Provisional application No. 61/745,529, filed on Dec. 21, 2012.

(51) Int. Cl.
*G11B 5/855* (2006.01)
*G11B 5/74* (2006.01)
*H01L 21/00* (2006.01)
*H01L 21/302* (2006.01)
*G03F 7/00* (2006.01)

(52) U.S. Cl.
CPC ............ *G11B 5/855* (2013.01); *G03F 7/0002* (2013.01); *G11B 5/746* (2013.01); *H01L 21/00* (2013.01); *H01L 21/302* (2013.01); *Y10T 428/24802* (2015.01); *Y10T 428/24926* (2015.01)

(58) Field of Classification Search
CPC ........ H01L 43/12; H01L 21/00; H01L 21/302
See application file for complete search history.

(56) References Cited

U.S. PATENT DOCUMENTS

| | | | |
|---|---|---|---|
| 5,304,461 A | 4/1994 | Inoue et al. | |
| 8,475,670 B2 | 7/2013 | Grobis et al. | |
| 8,623,223 B2 | 1/2014 | Dobisz et al. | |
| 8,673,541 B2 | 3/2014 | Xiao et al. | |
| 8,709,525 B2 | 4/2014 | Park et al. | |
| 9,079,216 B2 * | 7/2015 | Xiao ...................... | B05D 3/107 |
| 2009/0039560 A1 | 2/2009 | Nishikawa et al. | |
| 2012/0107583 A1 * | 5/2012 | Xiao ..................... | G03F 7/0002 428/210 |
| 2014/0072830 A1 * | 3/2014 | Lille ...................... | G11B 5/855 428/847 |

* cited by examiner

Primary Examiner — Duy Vu N Deo

(57) ABSTRACT

Provided herein are apparatuses and methods, including patterning a first set of features in a servo zone to form a patterned servo zone while a first mask protects a data zone from the patterning. The first mask may be removed from the data zone. The apparatuses and methods may further include patterning a second set of features in the data zone to form a patterned data zone while a second mask protects the patterned servo zone from the patterning.

11 Claims, 16 Drawing Sheets

TEMPLATES FOR PATTERNED MEDIA

CROSS REFERENCE

This application is a continuation-in-part of co-pending U.S. patent application Ser. No. 13/798,087, filed Mar. 13, 2013, which in turn, is a continuation-in-part of co-pending U.S. patent application Ser. No. 13/018,416, filed Jan. 31, 2011. The contents of the co-pending Applications are hereby incorporated by reference in their entirety. In addition, U.S. patent application Ser. No. 13/798,087 claims the benefit of U.S. Provisional Application No. 61/745,529, filed Dec. 21, 2012, which is hereby incorporated by reference in its entirety.

BACKGROUND

Bit-patterned media (BPM) fabrication technology uses low cost and high throughput nanoimprint lithography (NIL) to create sub-20 nanometer density patterns on a disk. The NIL may be used to fabricate BPM imprint templates at areal density of less than 1.5 Tera dots per square inch (Tdpsi).

SUMMARY

Provided herein are apparatuses and methods, including patterning a first set of features in a servo zone to form a patterned servo zone while a first mask protects a data zone from the patterning. The first mask may be removed from the data zone. The apparatuses and methods may further include patterning a second set of features in the data zone to form a patterned data zone while a second mask protects the patterned servo zone from the patterning.

These and other features and/or aspects of the concepts provided herein may be better understood with reference to the following drawings, description, and appended claims.

DETAILED DESCRIPTION

Figure 1:
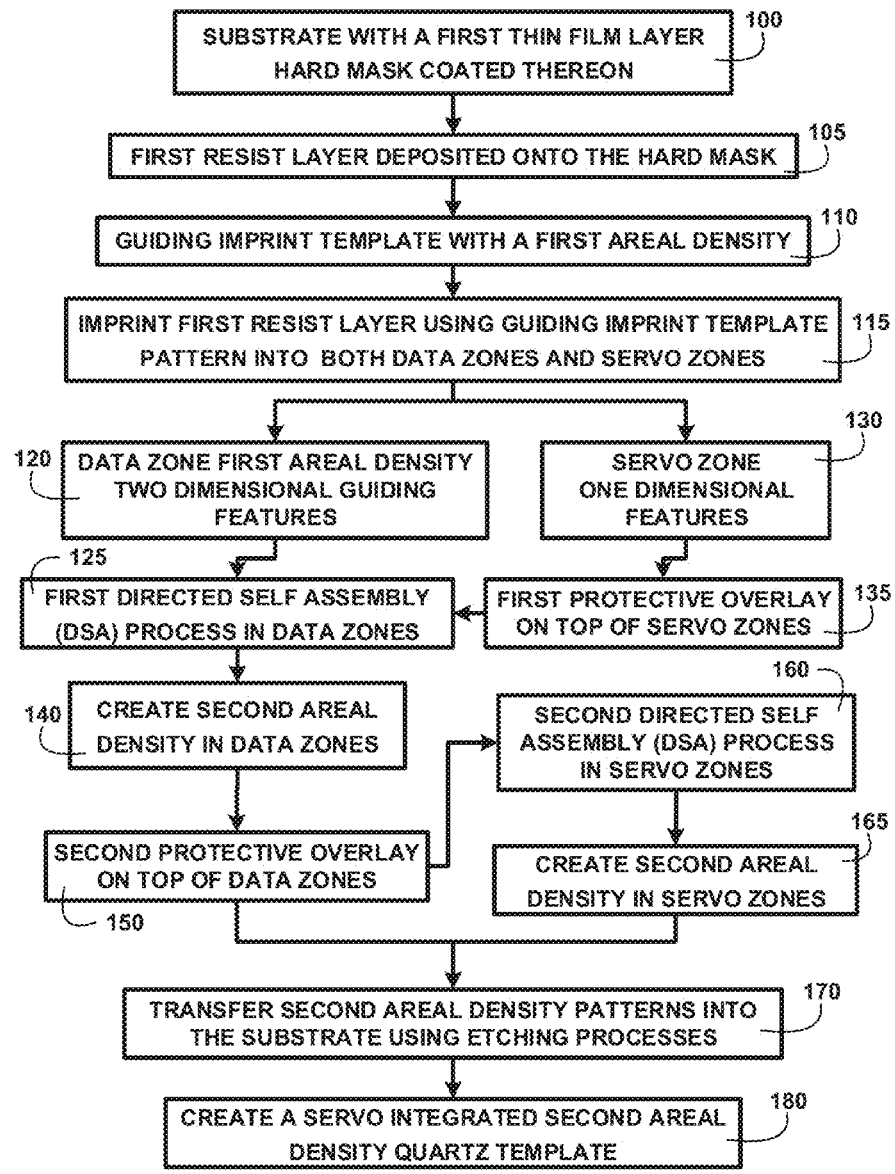
FIG. 1 illustrates a block diagram of an overview of method of fabricating servo integrated template according to one aspect of the present description.

Before some particular embodiments are illustrated and/or described in greater detail, it should be understood that the particular embodiments do not limit the scope of the concepts provided herein, as features of such particular embodiments may vary. It should likewise be understood that a particular embodiment has features that may be readily separated from the particular embodiment and optionally combined with or substituted for features of any of a number of other embodiments illustrated and/or provided herein.

It should be understood that the terminology used herein is for the purpose of describing some particular embodiments, and the terminology does not limit the scope of the concepts provided herein. Unless indicated otherwise, ordinal numbers (e.g., first, second, third, etc.) are used to distinguish or identify different features or steps in a group of features or steps, and do no supply a serial or numerical limitation. For example, "first," "second," and "third" features or steps need not necessarily appear in that order, and the particular embodiments need not necessarily be limited to the three features or steps. It should also be understood that, unless indicated otherwise, any labels such as "left," "right," "front," "back," "top," "bottom," "forward," "reverse," "clockwise," "counter clock-wise," "up," "down," or other similar terms such as "upper," "lower," "aft," "fore," "vertical," "horizontal," "proximal," "distal," and the like are used for convenience and are not intended to imply, for example, any particular fixed location, orientation, or direction. Instead, such labels are used to reflect, for example, relative location, orientation, or directions. It should also be understood that the singular forms of "a," "an," and "the" include plural references unless the context clearly dictates otherwise.

It should be understood that while a template for a patterned recording medium is described herein, features of the template may directly correspond to features of a patterned recording medium. It should also be understood that while features of a patterned recording medium are described herein, features of the patterned recording medium may directly correspond to features of a template. For example, features described in reference to protrusions in a template may directly correspond to magnetic features in a patterned recording medium.

Unless defined otherwise, all technical and scientific terms used herein have the same meaning as commonly understood by persons of ordinary skill in the art.

Provided herein are apparatuses including data and servo patterns patterned therein and methods related thereto. Apparatuses and methods for a data-first overlay are provided in a first section titled "Data-First Overlay Apparatuses and Methods," wherein process options result in patterning the data zone first. Apparatuses and methods for a servo-first overlay are provided in a second section titled "Servo-First Overlay Apparatuses and Methods," wherein process options result in patterning the servo zone first. However, it should be understood that the scope of the concepts provided herein is not delimited in accordance with the foregoing two-part presentation, as features of one or more particular embodiments in the first section may be readily separated out and combined with or substituted for features in any of a number of particular embodiments in the second section. Likewise, features of one or more particular embodiments in the second section may be readily separated out and combined with or substituted for features in any of a number of particular embodiments in the first section.

It should be noted that although BPM-related apparatuses and methods are provided herein, specific references to BPM are for illustrative purposes only and are not intended to be limiting in scope. For example, a template (e.g., microimprint template, nanoimprint template, etc.) may correspond to any recording medium or recording media to which lithographic (e.g., microlithographic, nanolithographic, etc.) patterning may be applied or extended. As such, the template may include, but is not limited to, a template for longitudinal magnetic recording ("LMR") media, a template for perpendicular magnetic recording ("PMR") media, a template for heat-assisted magnetic recording ("HAMR") media, a template for discrete track recording ("DTR") media, or a template for bit-patterned media (also "BPM"). In some embodiments, for example, the template may include a template for BPM such as rectangular BPM. Specific references to BPM herein are for illustrative purposes only and are not intended to be limiting in scope.

Data-First Overlay Apparatuses and Methods
General Overview:

It should be noted that the descriptions that follow, for example, in terms of a method of fabricating servo integrated template is described for illustrative purposes and the underlying system can apply to any number and multiple types of templates. In one embodiment, the method of fabricating servo integrated template can be configured using block copolymer (BCP) directed self-assembly (DSA). The method of fabricating servo integrated template can be configured to include BCP optical lithography and can be configured to include one-dimensional trench guide template patterns in servo zones using the present embodiments.

The following descriptions include using features for stack patterns including BPM dots but can include other stack patterns without departing from the present embodiments. FIG. 1 shows a block diagram of an overview of method of fabricating servo integrated template of one embodiment. FIG. 1 shows a substrate with a first thin film layer hard mask coated thereon 100. The substrate includes using materials including quartz or silicon. A first resist layer deposited onto the hard mask 105. The hard mask includes using a thin film of chromium (Cr). A process is used to imprint first resist layer using guiding imprint template pattern into both data zones and servo zones 115. The guiding imprint template includes using a two dimensional hexagonal imprinted resist dot pattern with a first areal density in data zones. The first areal density two dimensional guiding features 120 include a 375 Giga dots per square inch (Gdpsi) hexagonal pattern in data zones. The guiding imprint template includes using a one dimensional imprinted resist trench line pattern in servo zones. The servo zone one dimensional features 130 include trench patterns in servo zones of one embodiment.

Overlay processes are used to pattern both the data and servo zones. An overlay process uses two or more sets of template patterns that for example cover an entire surface and are divided into individual sections using an alignment scheme and alignment mark settings to identify the matching points where the sections were divided to enable aligning of those points to position each section accurately relative to the original undivided status position.

Overlay processes as described herein include a first protective overlay and a second protective overlay. The first protective overlay process is aligned over servo zones and a deposit of a protective layer is used to protect imprinted patterns in a servo zone resist layer. The protective layer protects the servo zone pattern during a process to pattern the unprotected data zones with a different areal density. The protective layer deposited in the first protective overlay process is then removed and the second protective overlay process is used to deposit a protective layer on the data zones. The protective layer protects the data zone pattern during a process to pattern the unprotected servo zones with a different areal density.

A first protective overlay on top of servo zones 135 protects the imprinted servo zone one dimensional features 130. A first DSA process in data zones 125 is used to create second areal density in data zones 140. A process is used to transfer second areal density patterns into the substrate using etching processes 170 from the data zones. A process is used to deposit a second protective overlay on top of data zones 150 etched into the substrate.

A second DSA process in servo zones 160 is used to create second areal density in servo zones 165. A process is used to transfer second areal density patterns into the substrate using etching processes 170. The transfers of the second areal density patterns of both the data zones and servo zones are used to create a servo integrated second areal density quartz template 180 used to fabricate stacks including BPM with a second areal density equal to or greater than 1.5 Tdpsi of one embodiment.

Figure 2A:
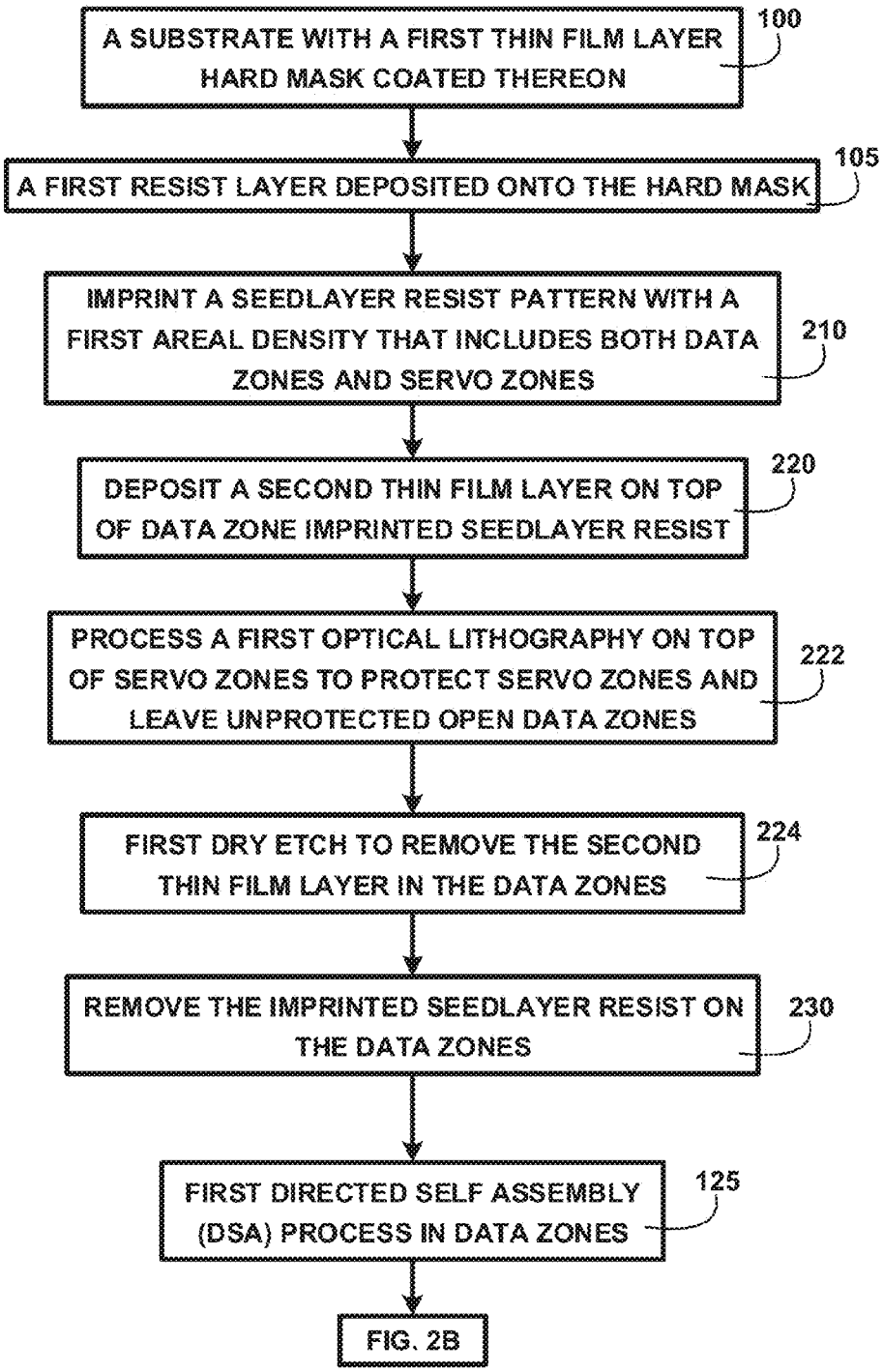
FIG. 2A illustrates a block diagram of an overview flow chart of method of fabricating servo integrated template according to one aspect of the present description.

Data Zones Overlay:

FIG. 2A shows a block diagram of an overview flow chart of method of fabricating servo integrated template of one embodiment. FIG. 2A shows the substrate with a first thin film layer hard mask coated thereon 100 and the first resist layer deposited onto the hard mask 105. A process is used to imprint a seedlayer resist pattern with a first areal density that includes both data zones and servo zones 210. A process is used to deposit a second thin film layer on top of data zone imprinted seedlayer resist 220.

The next step is to process a first optical lithography on top of servo zones to protect servo zones and leave unprotected open data zones 222. The first optical lithography is used to define the servo zones. A first dry etch to remove the second thin film layer in the data zones 224 and remove the imprinted seedlayer resist on the data zones 230. A first DSA process in data zone 232 is processed. The processes continue and are described in FIG. 2B of one embodiment.

Figure 2B:
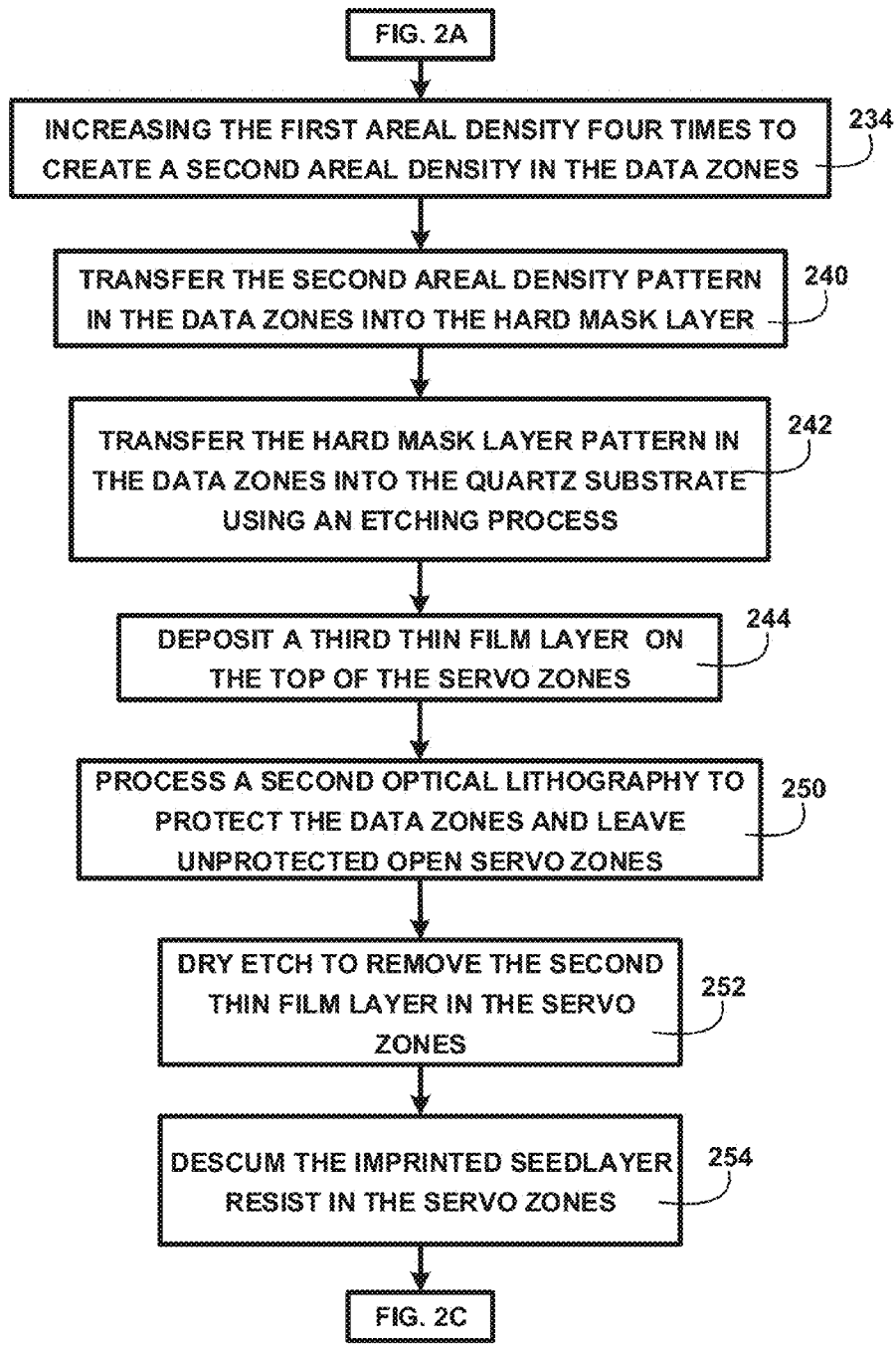
FIG. 2B illustrates a block diagram of an overview flow chart of servo zones overlay process according to one aspect of the present description.

Servo Zones Overlay:

FIG. 2B shows a block diagram of an overview flow chart of servo zones overlay process of one embodiment. FIG. 2B shows processes that continue from FIG. 2A. The first DSA process in data zone 232 of FIG. 2A are used for increasing the first areal density approximately four times to create a second areal density in the data zones 234. The increase in areal density can include a first areal density of for example 375 Gdpsi and the second areal density is increased to for example 1.5 Tdpsi. In another embodiment a first areal density of for example 800 Gdpsi will produce a second areal density of 3.2 Tdpsi. A process is used to transfer the second areal density pattern in the data zones into the hard mask layer 240. The BCP is removed and a process is used to transfer the hard mask layer pattern in the data zones into the quartz substrate using an etching process 242 including of one embodiment.

A process is used to deposit a third thin film layer on the top of the servo zones 244. A process is used to process a second optical lithography to protect the data zones and leave unprotected open servo zones 250. The second optical lithography is used to define the data zones. A dry etch to remove the second thin film layer in the servo zones 252 is used then followed by a process to descum the imprinted seedlayer resist in the servo zones 254. Descriptions of continuing processes are shown in FIG. 2C of one embodiment.

Figure 2C:
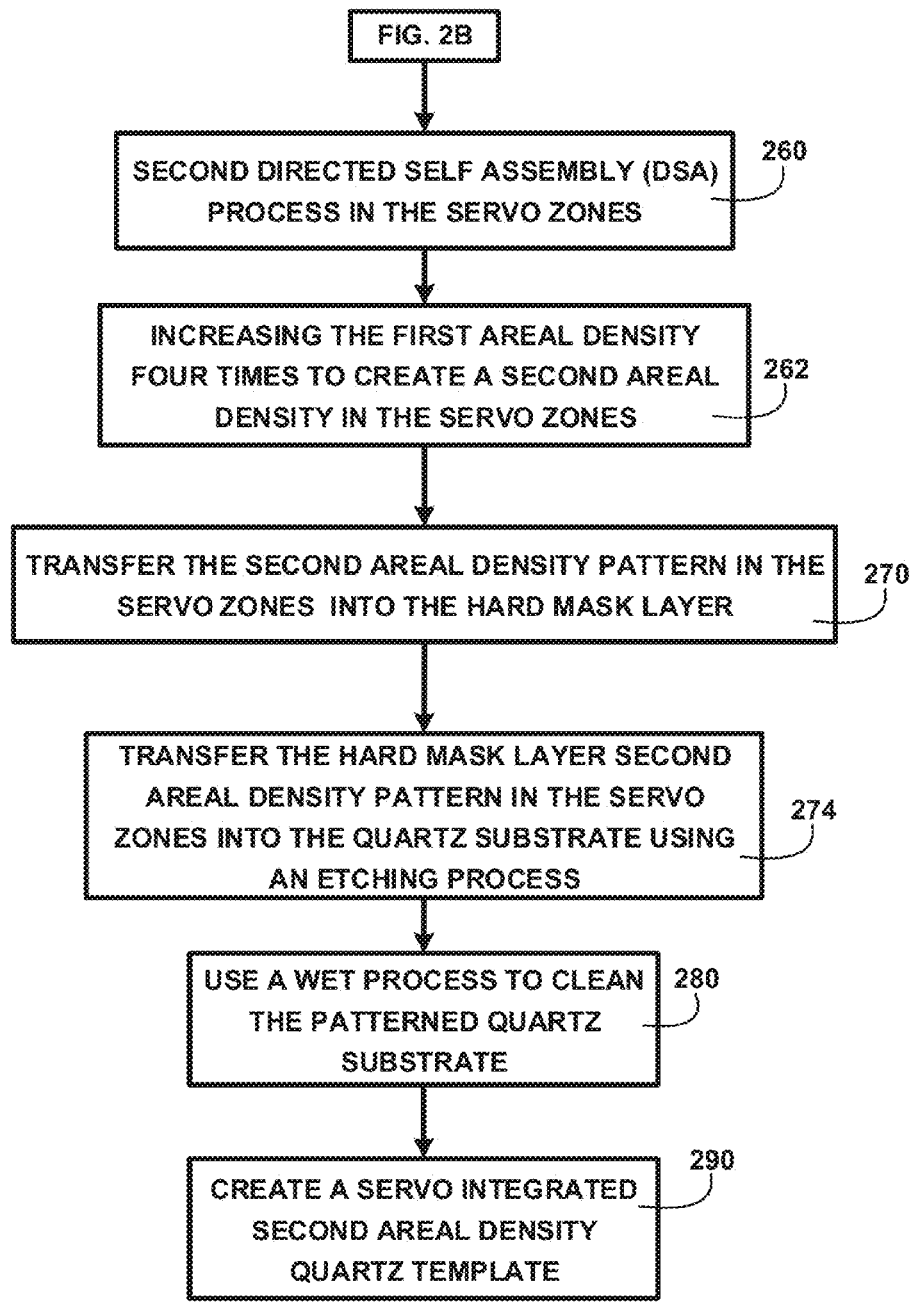
FIG. 2C illustrates a block diagram of an overview flow chart of a pattern transfer into a servo integrated template process according to one aspect of the present description.

Servo Integrated Quartz Template:

FIG. 2C shows a block diagram of an overview flow chart of a pattern transfer into a servo integrated template process of one embodiment. FIG. 2C shows continuing processing from FIG. 2B including a second DSA process in the servo zones 260. The second DSA process in the servo zones 260 is used for increasing the first areal density approximately four times to create a second areal density in the servo zones 262. A process is used to transfer the second areal density pattern in the servo zones into the hard mask layer 270. After removing the BCP material a process is used to transfer the hard mask layer second areal density pattern in the servo zones into the quartz substrate using an etching process 274 including carbon tetrafluoride ($CF_4$) reactive ion etching (RIE). The processing continues to use a wet process to clean the patterned quartz substrate 280. The method of fabricating servo integrated template has been used to create a servo integrated second areal density quartz template 290 with both periodic features in the data zones and non-periodic features in the servo zones of one embodiment.

Figure 3A:
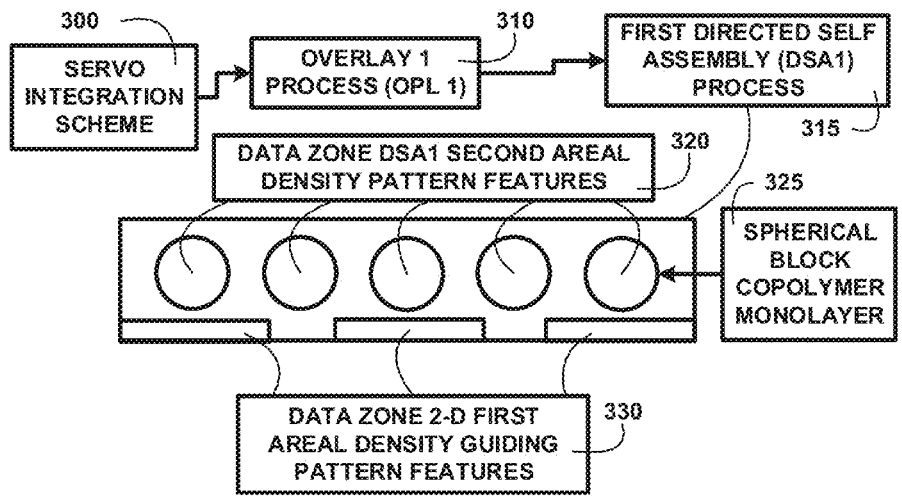
FIG. 3A illustrates for illustrative purposes only an example of a first overlay process according to one aspect of the present description.

Overlay 1 process (OPL 1):

FIG. 3A shows for illustrative purposes only an example of a first overlay process of one embodiment. FIG. 3A shows a servo integration scheme 300 including an overlay 1 process (OPL 1) 310 followed by a first directed self-assembly process 315. The first directed self-assembly process 315 uses data zone 2-D first areal density guiding pattern features 330 to create data zone DSA1 second areal density pattern features 320 of a spherical block copolymer monolayer 325 of one embodiment.

Figure 3B:
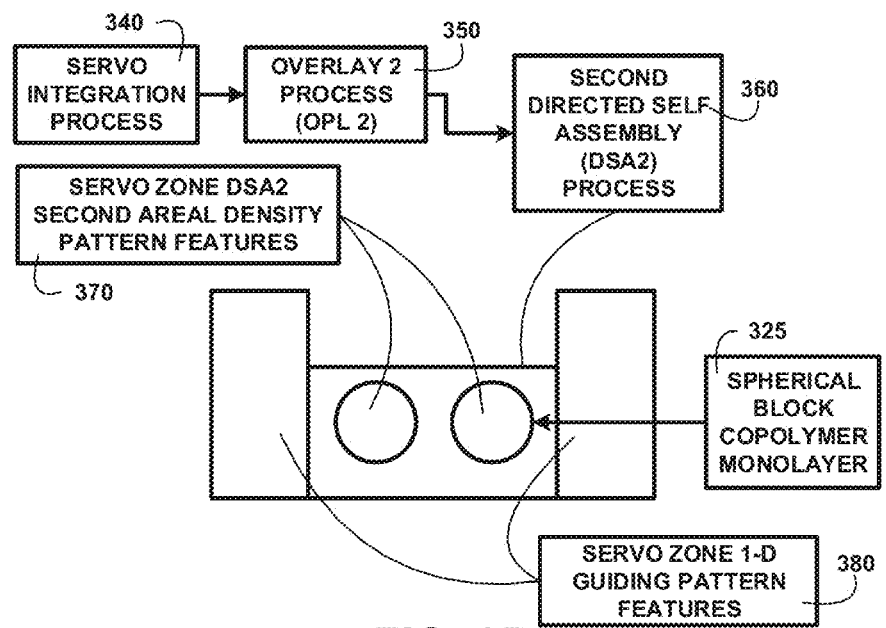
FIG. 3B illustrates for illustrative purposes only an example of a second overlay process according to one aspect of the present description.

Overlay 2 Process (OPL 2):

FIG. 3B shows for illustrative purposes only an example of a second overlay process of one embodiment. FIG. 3B shows a servo integration process 340 using an overlay 2 process (OPL 2) 350 and a second directed self-assembly process 360. The second directed self-assembly process 360 uses servo 1-D guiding pattern features 380 to create servo zone DSA2 second areal density pattern features 370 of a spherical block copolymer monolayer 325 of one embodiment.

Figure 4A:
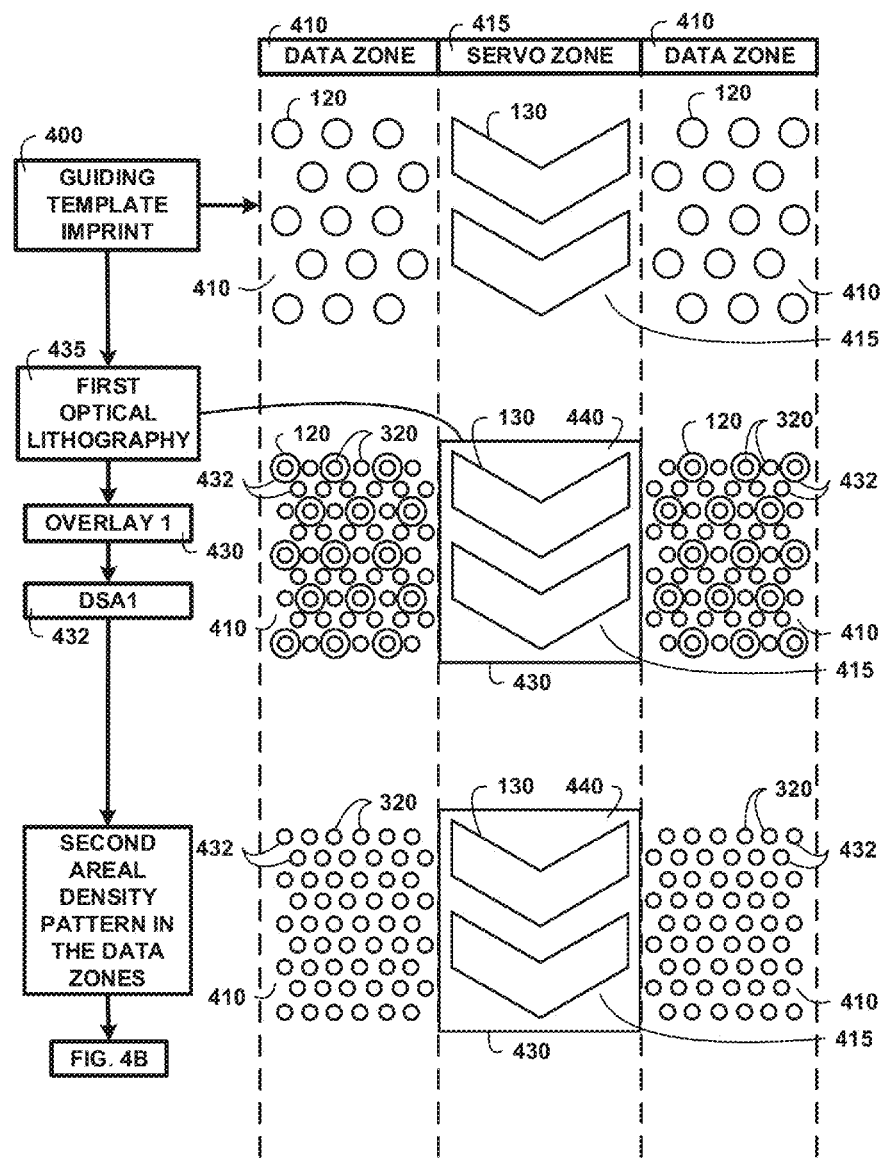
FIG. 4A illustrates for illustrative purposes only an example of fabricating a servo integrated template according to one aspect of the present description.

Guiding Template:

FIG. 4A shows for illustrative purposes only an example of fabricating a servo integrated template of one embodiment. FIG. 4 shows a guiding template imprint 400 that includes in a data zone 410 data zone first areal density two dimensional guiding features 120. The guiding template imprint 400 includes in the servo zone 415 servo zone one dimensional features 130 of one embodiment. The data zone first areal density two dimensional guiding features 120 includes using for example a 375 Gdpsi hexagonal pattern and an 800 Gdpsi hexagonal pattern of dots for fabricating BPM templates used to create BPM stacks. The servo zone one dimensional features 130 includes lines and other shapes to guide a BCP DSA used in creating an integrated servo zone of one embodiment.

Overlay 1 and DSA 1:

An overlay 1 430 and DSA1 432 use a first optical lithography 435 to protect servo zones 440. The servo zone 415 includes the servo zone one dimensional features 130. The first optical lithography 435 leaves the data zones open for other processing. In the data zone 410 a process including a BCP DSA is used to create data zone DSA1 second areal density pattern features 320 using the data zone first areal density two dimensional guiding features 120. The DSA1 process in data zone includes using for example a hexagonal imprint guiding pattern 375 Gdpsi pattern to increase the number of features by a factor of 4 to create a second areal density of 1.5 Tdpsi in the data zone. Other processes are described in FIG. 4B of one embodiment.

Figure 4B:
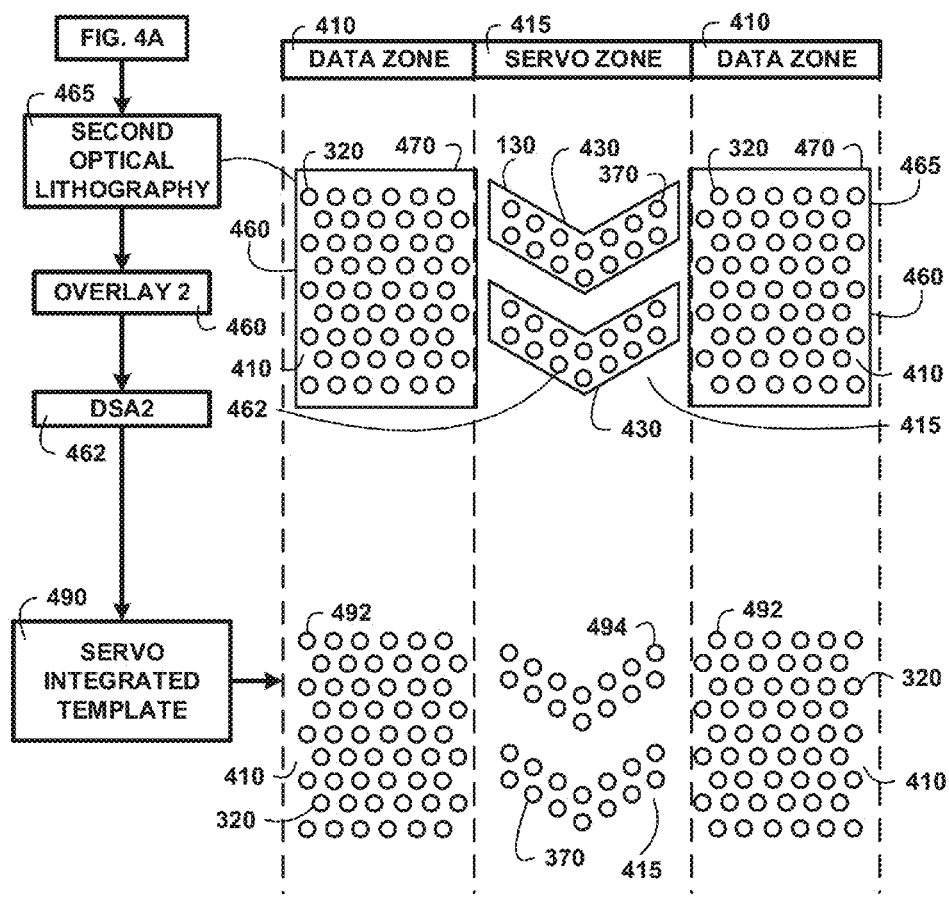
FIG. 4B illustrates for illustrative purposes only an example of fabricating a servo integrated template according to one aspect of the present description.

Overlay 2 and DSA 2:

FIG. 4B shows for illustrative purposes only an example of fabricating a servo integrated template of one embodiment. An overlay 2 460 and DSA2 462 use a second optical lithography 465 to protect the data zones 470 wherein the data zone DSA1 second areal density pattern features 320 have been etched into a substrate. The second optical lithography 465 to protect the data zones 470 defines the data zone 410. In the open or unprotected servo zone 415 the servo zone one dimensional features 130 are used in for example a BCP DSA to create servo zone DSA2 second areal density pattern features 370. The servo zone DSA2 second areal density pattern features 370 include for example a second areal density of 1.5 Tdpsi. The servo zone DSA2 second areal density pattern features 370 are etched into the substrate of one embodiment.

Servo Integrated Template:

FIG. 4B additionally shows in the data zone 410 data zone DSA1 second areal density pattern features etched into substrate 492 are periodic features. In the servo zone 415 servo zone DSA2 second areal density pattern features etched into substrate 494 are non-periodic features. FIG. 4B shows an illustration of the integration of data zone 410 second areal density periodic features and servo zone 415 second areal density non-periodic features with a servo integrated template 490. The first areal density imprint includes for example using a 375 Gdpsi hexagonal pattern to create a second areal density of 1.5 Tdpsi servo integrated template 490 and for example using a first areal density 800 Gdpsi imprint to create a second areal density of 3.2 Tdpsi servo integrated template 490 of one embodiment.

Figure 5A:
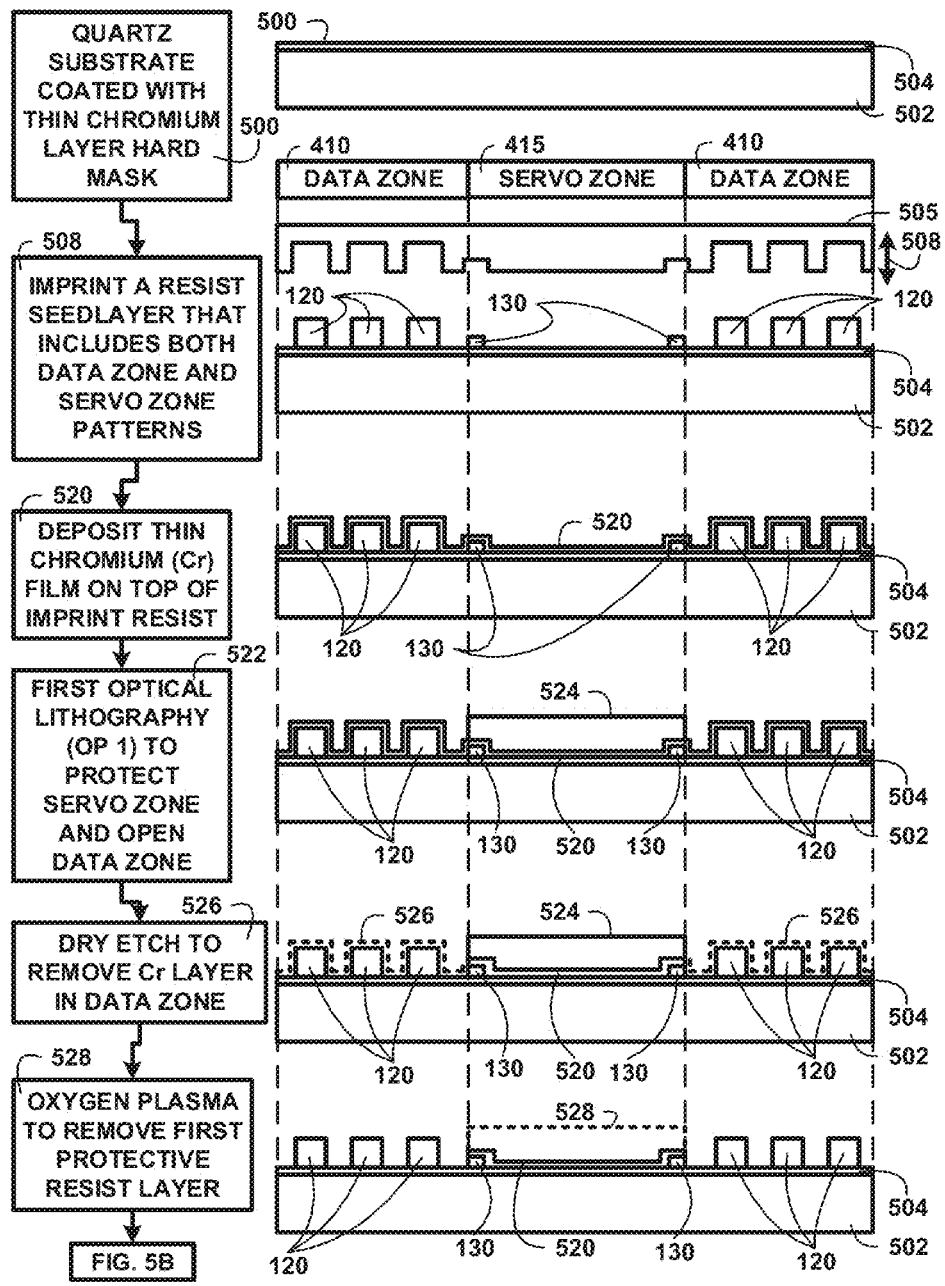
FIG. 5A illustrates for illustrative purposes only an example of an imprinted seed layer with integrated data and servo zones according to one aspect of the present description.

Imprinted Seedlayer:

FIG. 5A shows for illustrative purposes only an example of an imprinted seedlayer with integrated data and servo zones of one embodiment. FIG. 5A shows a substrate that can be used in the method of fabricating servo integrated template to create a servo integrated template. The substrate includes a quartz substrate 502. The method of fabricating servo integrated template includes coating the quartz substrate 502 with a hard mask including a thin Cr layer hard mask 504. A quartz substrate coated with thin Cr layer hard mask 500 is ready for further processing of one embodiment.

The process continues to imprint a resist seedlayer that includes both data zone and servo zone patterns 508. A seedlayer guiding imprint template 505 is used to imprint first areal density two dimensional guiding features 120 in the data zone 410. The seedlayer guiding imprint template 505 imprints one dimensional features 130 in the servo zone 415. A process is used to deposit thin Cr film on top of imprint resist 520. A first optical lithography (OP 1) to protect servo zone and open data zone 522 process is used to deposit a first protective resist layer 524 on top of the servo zone. A dry etch to remove Cr layer in data zone 526 is processed to open the data zone for further processing. A process using oxygen plasma to remove first protective resist layer 528 is in preparation for further processing. The processes that follow are described in FIG. 5B of one embodiment.

Figure 5B:
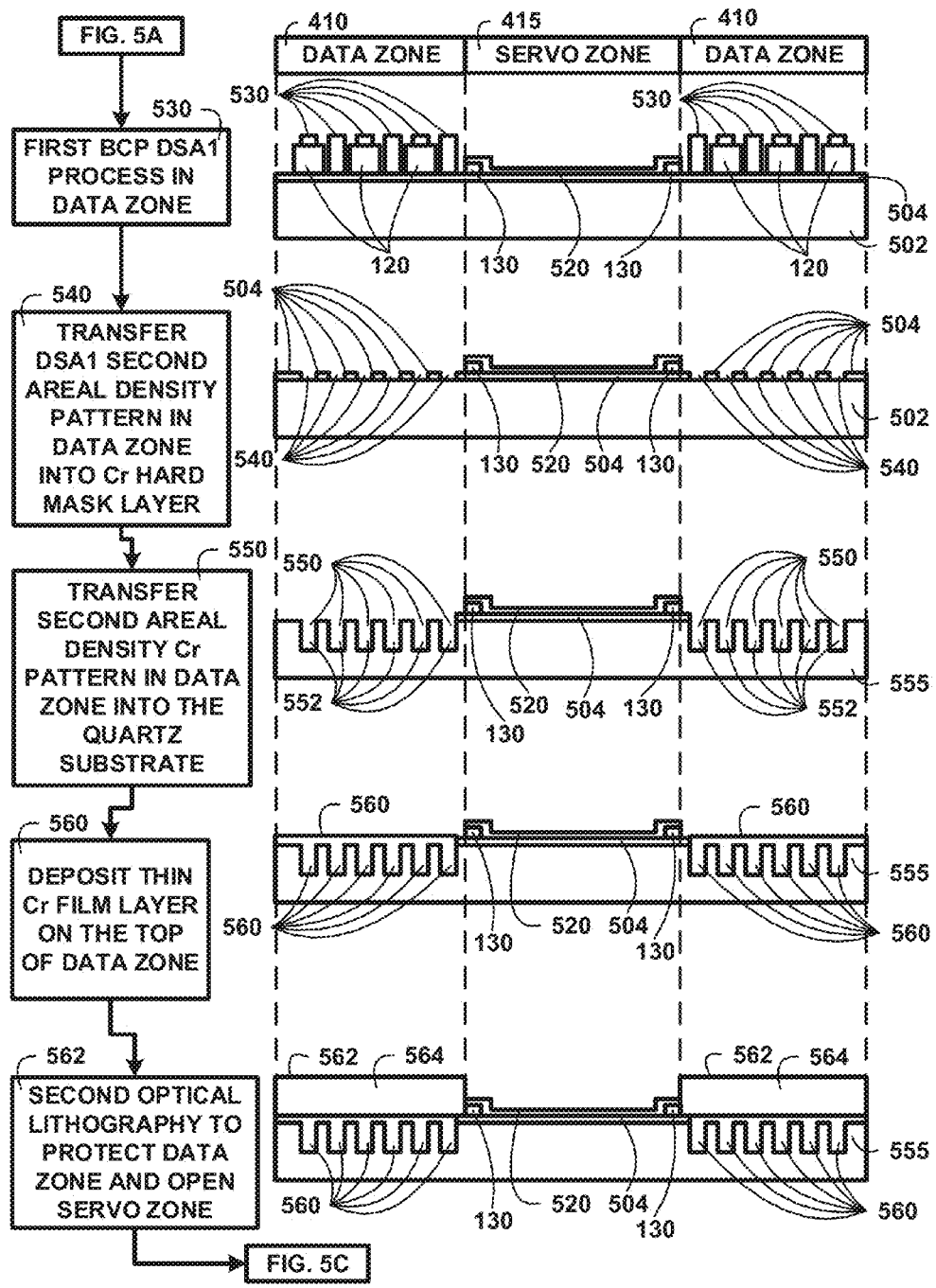
FIG. 5B illustrates for illustrative purposes only an example of a data zone first block copolymer directed self-assembly process according to one aspect of the present description.

First BCP DSA1:

FIG. 5B shows for illustrative purposes only an example of a data zone first block copolymer directed self-assembly process of one embodiment. FIG. 5B shows processes continuing from FIG. 5A. FIG. 5B shows a first BCP DSA1 process in data zone 530. The first BCP DSA1 process in data zone 530 creates second areal density pattern features. A process including $CF_4$ RIE to transfer DSA1 second areal density pattern in data zone into Cr hard mask layer 540. A $CF_4$ RIE process is used to transfer second areal density Cr patterns in data zone into the quartz substrate 550. The $CF_4$ RIE process creates etched second areal density data zone pattern features 552 in the quartz substrate 502. A quartz substrate with etched data zone features 555 is processed including a second optical lithography to protect data zone and open servo zone 562. The second optical lithography to protect data zone and open servo zone 562 includes a second protective resist layer 564 on top of the etched data zones. Descriptions of subsequent processes are shown in FIG. 5C of one embodiment.

Figure 5C:
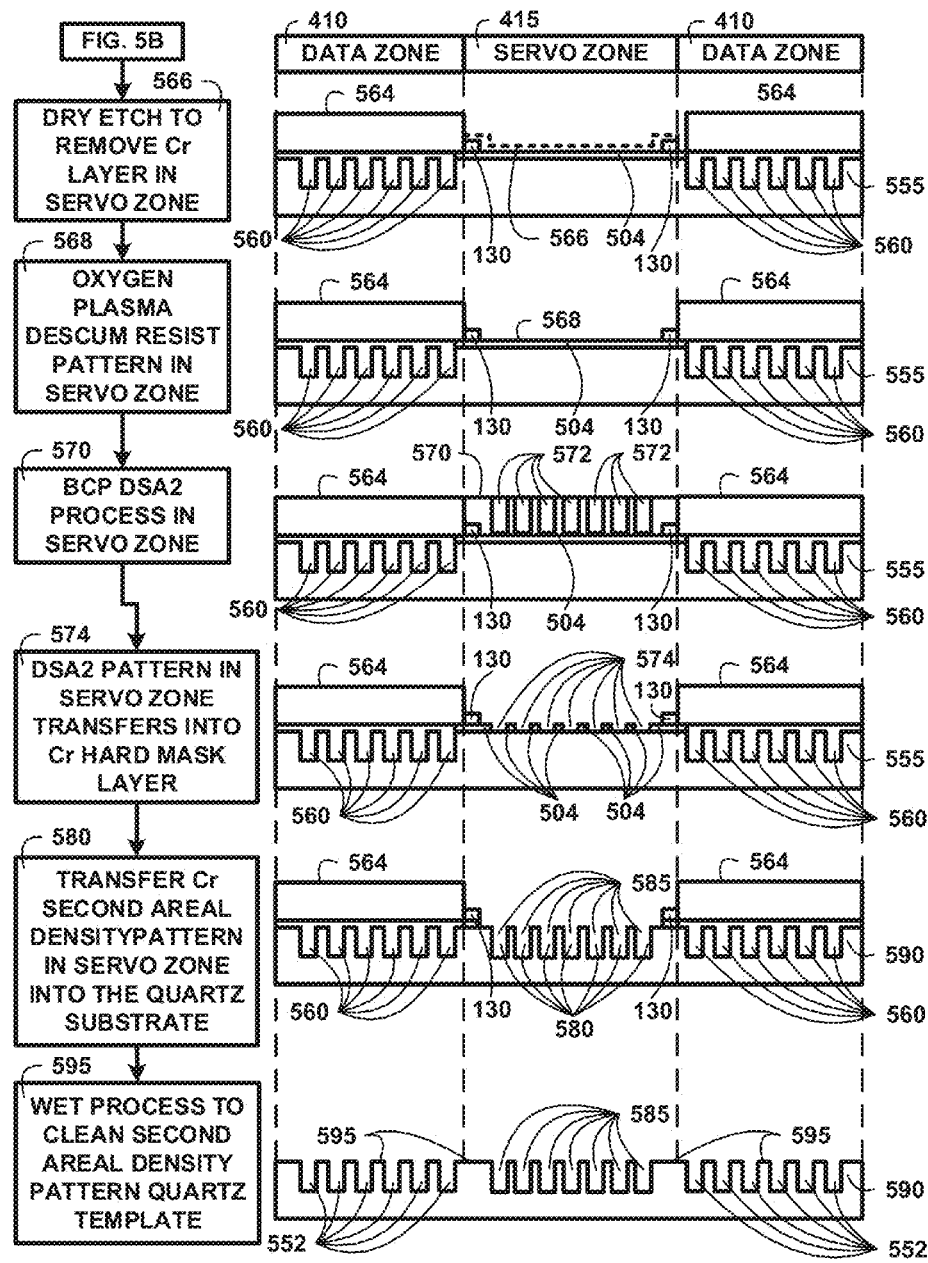
FIG. 5C illustrates for illustrative purpose only an example of a servo zone second block copolymer directed self-assembly process according to one aspect of the present description.

Second BCP DSA1:

FIG. 5C shows for illustrative purposes only an example of a servo zone second block copolymer directed self-assembly process of one embodiment. FIG. 5C shows a continuation of processes from FIG. 5B including a dry etch to remove Cr layer in servo zone 566. An oxygen plasma descum resist pattern in servo zone 568 is process to clean the servo zone 415. A BCP DSA2 process in servo zone 570 is used to create second areal density patterns 572. The $CF_4$ RIE process is used to process DSA2 pattern in servo zone transfers into Cr hard mask layer 574 of one embodiment.

The $CF_4$ RIE process is used to transfer Cr second areal density pattern in servo zone into the quartz substrate 580. The etched servo second areal density patterns 585 are non-periodic. The addition of the etched servo second areal density patterns 585 creates a second areal density servo integrated template 590. A wet process to clean second areal density pattern quartz template 595 reveals the second areal density servo integrated template 590 including the periodic etched second areal density data zone pattern features 552 and the non-periodic etched servo second areal density patterns 585 of one embodiment.

In an alternative to the foregoing data-first overlay apparatuses and methods, servo-first overlay apparatuses and methods may be used. In servo-first overlay apparatuses and methods, the servo zone may be patterned first while the data zone is protected. By patterning the data zone after patterning the servo zone, a step height between the forgoing zones may be reduced, thereby reducing the potential for step-height-related defects.

Servo-First Overlay Apparatuses and Methods

Figure 6:
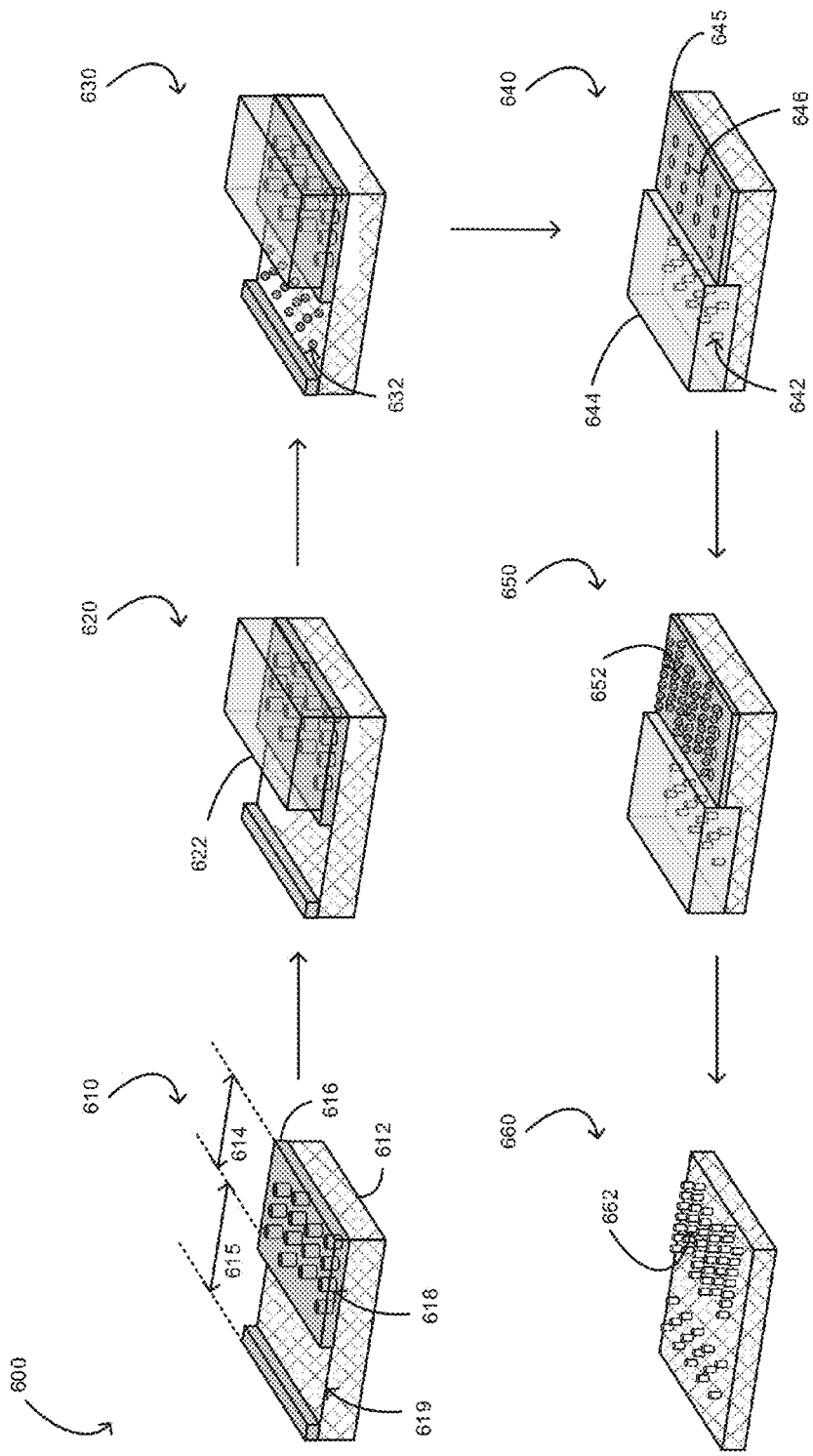
FIG. 6 illustrates a scheme for BPM template fabrication according to one aspect of the present description.

FIG. 6 illustrates a scheme 600 for BPM template fabrication in accordance with some embodiments. As shown in FIG. 6, the method may commence with an apparatus 610 comprising a substrate 612, a resist layer 616 deposited on the substrate 612, a data zone 614, and a servo zone 615. The substrate 612 may be comprised of materials such as quartz or silicon. The resist layer 616 may be nanoimprinted with guiding patterns 618 in the data zone 614, as well guiding patterns 619 as in the servo zone 615. The guiding patterns 618 in the data zone 614 and the guiding patterns 619 in the servo zone 615 may be multi-dimensional, two-dimensional, or one-dimensional. It should be noted that any specific references to dimensions are for illustrative purposes only and are not intended to be limiting in scope.

In apparatus 620, a first protective mask 622 may be applied above the data zone 614. The first protective mask may be a hard mask (e.g., a hard mask of a metal such as Cr), a soft mask of a resist, or a combination thereof.

In apparatus 630, a pattern of block copolymers 632 may be self-assembled in the servo zone 615 while the first protective mask 622 protects the data zone 614. While a spherical morphology is show in FIG. 6, for example, block copolymers of different morphologies may be used, such as cylindrical or lamellar morphologies. In some embodiments, the pattern of block copolymers 632 may comprise multi-block copolymers wherein each block is either organic (e.g., polystyrene-block-polymethylmethacrylate, polystyrene-block-polyethyleneoxide, polystyrene-block-polyisoprene, or polystyrene-block-polybutadine) or inorganic (e.g., polystyrene-block-polydimethylsiloxane or polystyrene-block-polyferrocenylsilane). The guiding patterns 619 in the servo zone 615 have a high topography useful in guiding the self-assembly of the pattern of block copolymers 632.

In apparatus 640, the pattern of block copolymers 632 in the servo zone 615 may be transferred into the substrate 612 through a process such as etching to create a patterned servo zone 642. The first protective mask 622 may then be removed and a second protective mask 644 may be applied over the patterned servo zone 642. The second protective mask may be a hard mask (e.g., a hard mask of a metal such as Cr), a soft mask of a resist, or a combination thereof. A process such as optical lithography, followed by a thinning of the resist layer 616 to create a thinned resist 645, may be used to generate a low topography, two-dimensional prepattern 646 in the data zone 614. It should be noted that although a two-dimensional prepattern is provided herein, specific references to a two-dimensional prepattern are for illustrative purposes only and are not intended to be limiting in scope. In some embodiments, for example, the prepattern pattern may be multi-dimensional.

In apparatus 650, a pattern of block copolymers 652 may be self-assembled in the in the data zone 614 while the second protective mask 644 protects the patterned servo zone 642. While a spherical morphology is show in FIG. 6, for example, block copolymers of different morphologies may be used, such as cylindrical or lamellar morphologies. In some embodiments, the pattern of block copolymers 652 may comprise multi-block copolymers wherein each block is either organic (e.g., polystyrene-block-polymethylmethacrylate, polystyrene-block-polyethyleneoxide, polystyrene-block-polyisoprene, or polystyrene-block-polybutadine) or inorganic (e.g., polystyrene-block-polydimethylsiloxane or polystyrene-block-polyferrocenylsilane). In some embodiments, the pattern of block copolymers 652 may comprise the same combination of block copolymers as the forgoing pattern of block copolymers 632. In some embodiments, the pattern of block copolymers 652 may comprise a different combination of block copolymers than the foregoing pattern of block copolymers 632. The pattern of block copolymers 652 in the data zone 614 may be transferred into the substrate 612 through a process such as etching to create a patterned data zone 662.

The second protective mask 644 may then be removed to create apparatus 660, which illustrates the fabricated patterned media template with a patterned servo zone 642 and a patterned data zone 662.

Figure 7A:
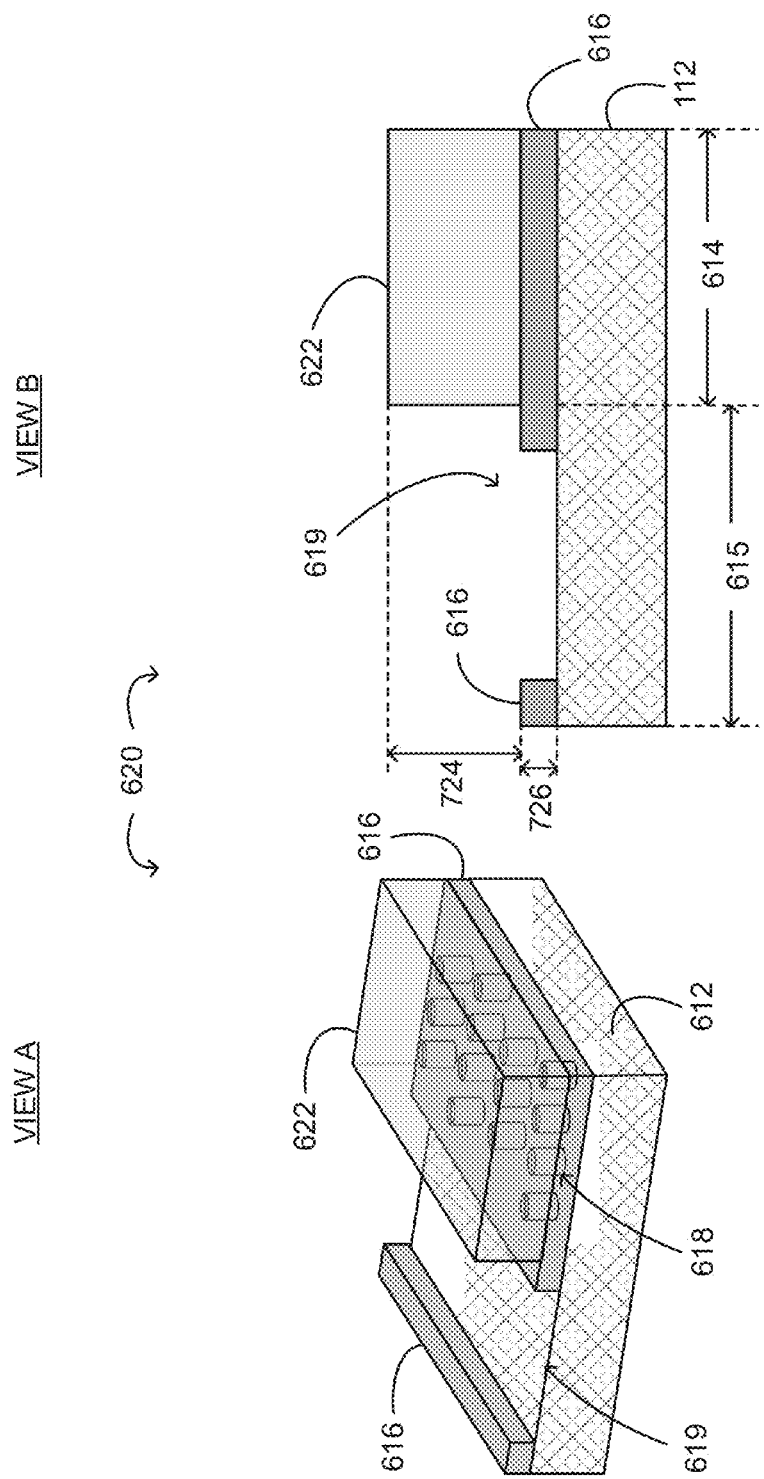
FIG. 7A illustrates an apparatus for BPM template fabrication according to one aspect of the present description.

FIG. 7A illustrates an apparatus 620 for BPM template fabrication in accordance with some embodiments. As shown in FIG. 7A, a first protective mask 622 may be applied above the resist layer 616 in the data zone 614 to protect the guiding patterns 618 imprinted in the resist layer 616. The thickness 724 of the first protective mask 622 may be thicker or thinner than the thickness 726 of the resist layer 616. The thickness 724 of the first protective mask 622 may also be approximately equal to the thickness 726 of the resist layer 616. Guiding patterns 619 may be generated in the servo zone 615 so that the thickness 726 of the resist layer 616 on both sides of the guiding patterns 619 provides a high topography useful in guiding the self-assembly of the pattern of block copolymers 632.

Figure 7B:
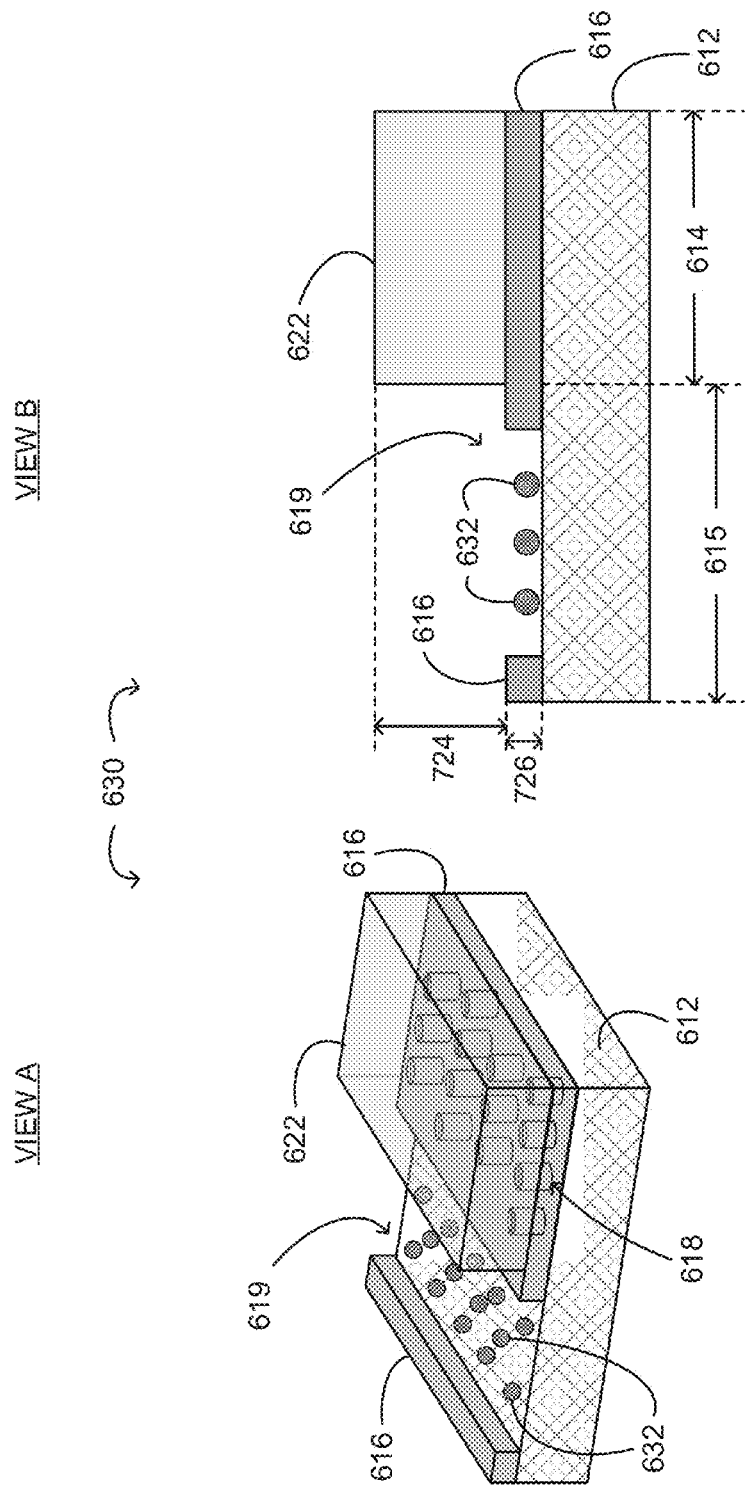
FIG. 7B illustrates an apparatus for BPM template fabrication according to one aspect of the present description.

FIG. 7B illustrates an apparatus 630 for BPM template fabrication in accordance with some embodiments. As shown in FIG. 7B, a pattern of block copolymers 632 may be self-assembled in the servo zone 615 while the first protective mask 622 above the data zone 614 protects the guiding patterns 618 imprinted in the resist 616. The thickness 726 of the resist layer 616 on both sides of the guiding patterns 619 provides a high topography useful in guiding the DSA of the pattern of block copolymers 632.

In some embodiments, the pattern of block copolymers 632 may comprise block copolymers wherein which each block of the block copolymers is an organic block, such as polystyrene-block-polymethylmethacrylate (PS-b-PMMA), polystyrene-block-polyethyleneoxide, polystyrene-block-polyisoprene or polystyrene-block-polybutadine. In some embodiments, the pattern of block copolymers 632 may comprise at least one inorganic block, such as polystyrene-block-polydimethylsiloxane (PS-b-PDMS or, more compactly, PS-PDMS) or polystyrene-block-polyferrocenylsilane. A person having ordinary skill in the art will appreciate that the processes described herein may be varied accordingly depending on the chemical characteristics of the block copolymers. One will appreciate that selection of the block copolymers may also depend upon the target pattern to be created using the block copolymers. For example, the topographical pattern left by the imprinting described herein may determine the selection of the block copolymers, since certain block copolymers may correlate better with certain topographical pattern features and pattern dimensions. For example, PS-PDMS may be utilized to form spherical block copolymer structures.

Figure 7C:
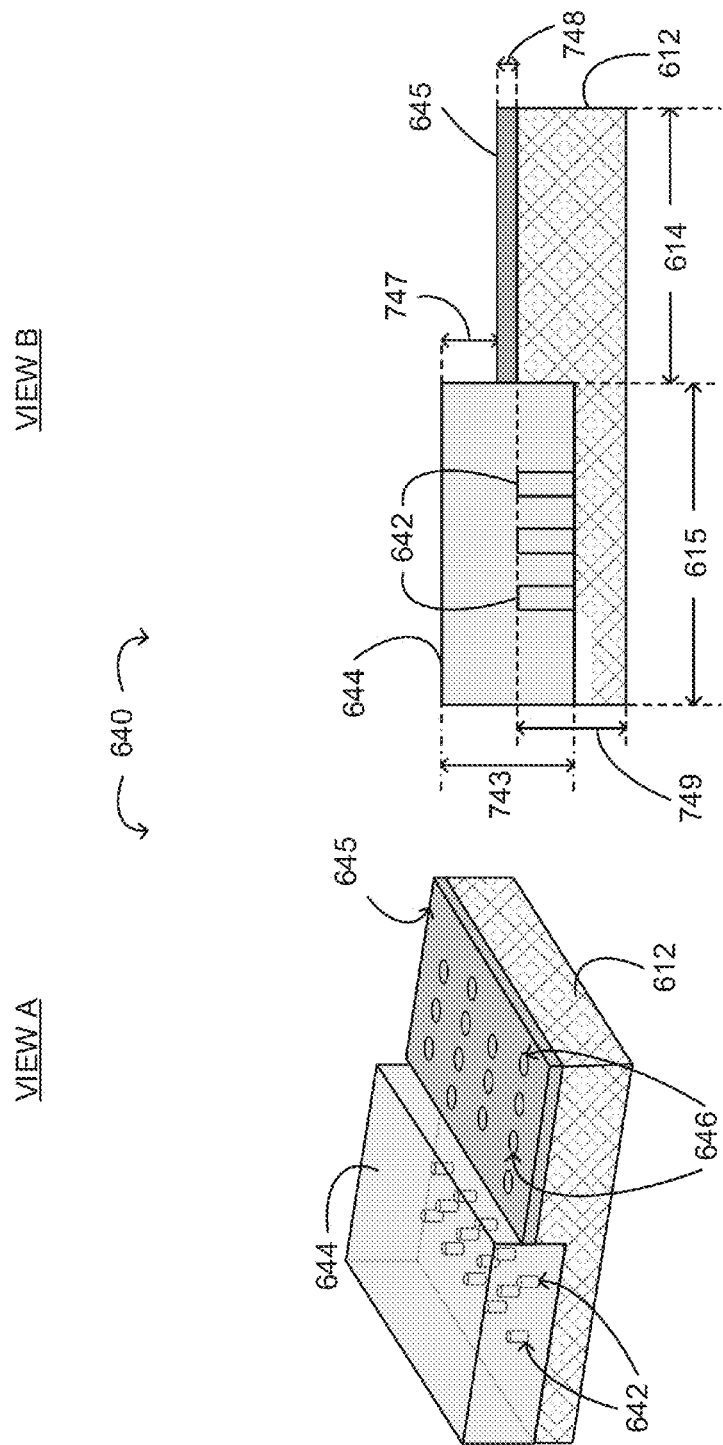
FIG. 7C illustrates an apparatus for BPM template fabrication according to one aspect of the present description.

FIG. 7C illustrates an apparatus 640 for BPM template fabrication in accordance with some embodiments. As shown in FIG. 7C, a patterned servo zone 642 may be created through a process such as etching. A height 749 from the top of the patterned servo zone 642 features to the bottom of the substrate 612 may be about the same height from the bottom of the thinned resist 645 in the data zone 614 to the bottom of the substrate 612. The thickness 743 of the second protective mask 644 may be thicker or thinner than the thickness 748 of the thinned resist 645. The thickness 743 of the second protective mask 644 may also be approximately equal to the thickness 748 of the thinned resist 645. The thinned resist 645 has a thickness 748 that is less than the thickness 726 (FIG. 7B) of the resist layer 616 prior to thinning. A step height 747 may be formed from the top of the second protective mask 644 in the servo zone 615 to the top of the thinned resist 645 in the data zone 614. An analogous data-first overlay step height from the top of overlay 1 430 (FIG. 4A) in the servo zone 415 (FIG. 4A) to the top of the two dimensional guiding features 120 (FIG. 4A) in the data zone 410 (FIG. 4A) may be about 45 nanometers. The step height 747 may be smaller than the analogous data-first overlay step height, which may reduce the potential for defects in the template.

The step height 747 may range between 0 nanometers and 45 nanometers. In some embodiments, for example, the step height 747 may range between 5 and 30 nanometers, 5 and 20 nanometers, or 5 and 15 nanometers. In some embodiments, for example, the step height 747 may be less than 5, 10, 15, 20, 25, 30, 35, 40 or 45 nanometers. In some embodiments, for example, the step height 747 may be no more than or up to about 5, 10, 15, 20, 25, 30, 35, 40 or 45 nanometers. Decreasing the step height further reduces the potential for defects. As such, the smaller the step height, the less likely defects will form.

Figure 7D:
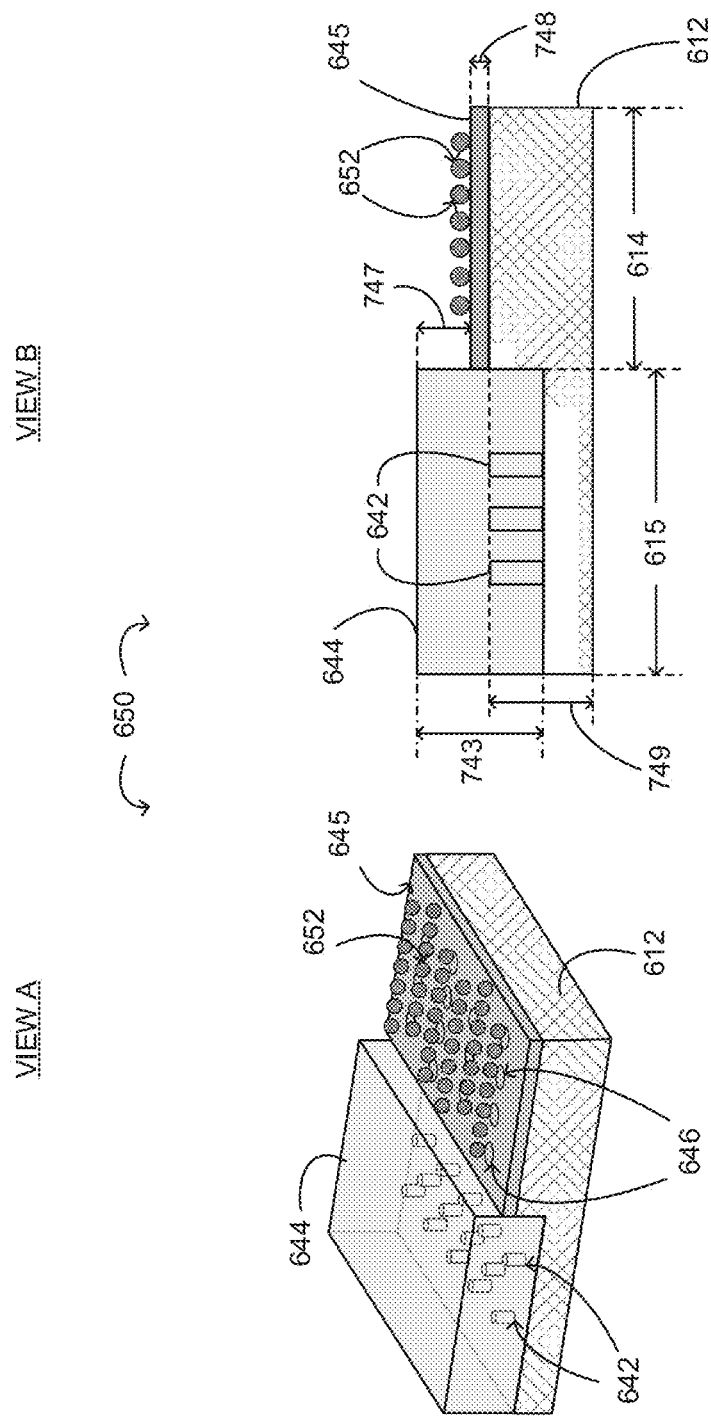
FIG. 7D illustrates an apparatus for BPM template fabrication according to one aspect of the present description.

FIG. 7D illustrates an apparatus 650 for BPM template fabrication in accordance with some embodiments. As shown in FIG. 7D, a pattern of block copolymers 652 may be self-assembled in the data zone 614 while the second protective mask 644 above the servo zone 614 protects the patterned servo zone 642. The low topography, two-dimensional prepattern 646 guides the self-assembly of the pattern of block copolymers 652 in the data zone 614.

In some embodiments, the pattern of block copolymers 652 may comprise block copolymers wherein which each block of the block copolymers is an organic block, such as polystyrene-block-polymethylmethacrylate (PS-b-PMMA), polystyrene-block-polyethyleneoxide, polystyrene-block-polyisoprene or polystyrene-block-polybutadine. In some embodiments, the pattern of block copolymers 652 may comprise at least one inorganic block, such as polystyrene-block-polydimethylsiloxane (PS-b-PDMS or, more compactly, PS-PDMS) or polystyrene-block-polyferrocenylsilane. A person having ordinary skill in the art will appreciate that the processes described herein may be varied accordingly depending on the chemical characteristics of the block copolymers. One will appreciate that selection of the block copolymers may also depend upon the target pattern to be created using the block copolymers. For example, the topographical pattern left by the imprinting described herein may determine the selection of the block copolymers, since certain block copolymers may correlate better with certain topographical pattern features and pattern dimensions. For example, PS-PDMS may be utilized to form spherical block copolymer structures.

Figure 8:
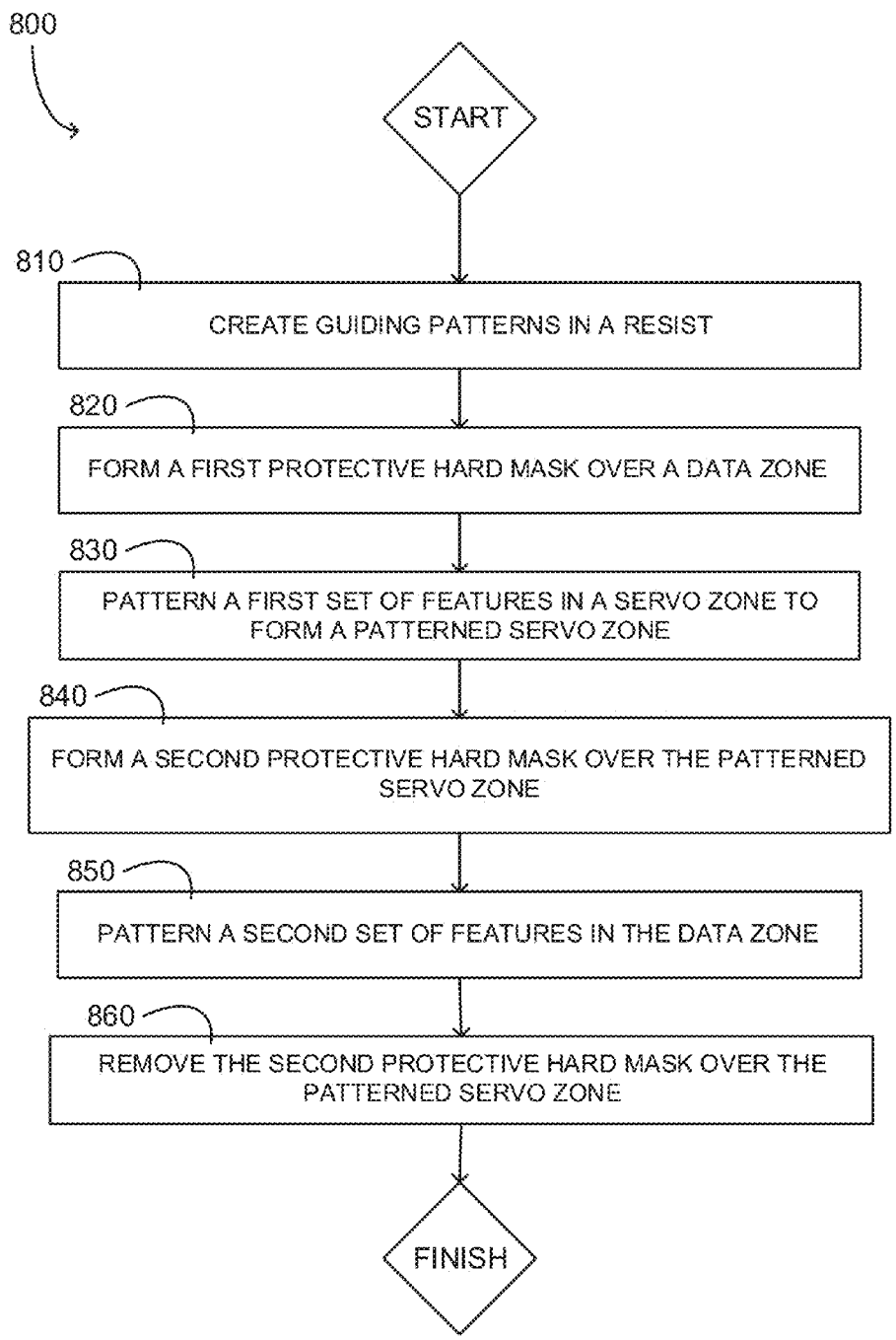
FIG. 8 illustrates a flow chart of a method for BPM template fabrication according to one aspect of the present description.

FIG. 8 illustrates a flow chart 800 of a method for BPM template fabrication in accordance with some embodiments. In block 810, a resist layer 616 deposited on the substrate 612 may be nanoimprinted to create guiding patterns in both the data zone 614 and the servo zone 615. The guiding patterns 618 in the data zone 614 and the guiding patterns 619 in the servo zone 615 may be multi-dimensional, two-dimensional, or one-dimensional. It should be noted that any specific references to dimensions are for illustrative purposes only and are not intended to be limiting in scope. In block 820, a first protective mask 622 may be applied above the data zone 614. The first protective mask may be a hard mask (e.g., a hard mask of a metal such as Cr), a soft mask of a resist, or a combination thereof. In block 830, a process such as optical lithography may be used to generate guiding patterns 619 in the servo zone 615. DSA in the servo zone 615 may subsequently be used to create a pattern of block copolymers 632.

While a spherical morphology is show in FIG. 6, for example, block copolymers of different morphologies may be used, such as cylindrical or lamellar morphologies. In some embodiments, the pattern of block copolymers 632 may comprise multi-block copolymers wherein each block is either organic (e.g., polystyrene-block-polymethylmethacrylate, polystyrene-block-polyethyleneoxide, polystyrene-block-polyisoprene, and polystyrene-block-polybutadine) or inorganic (e.g., polystyrene-block-polydimethylsiloxane or polystyrene-block-polyferrocenylsilane). The pattern of block copolymers 632 in the servo zone 615 may be transferred into the substrate 612 through a process such as etching to create a patterned servo zone 642.

In block 840, the first protective mask 622 may be removed and a second protective mask 644 may be applied over the patterned servo zone 642. The first protective mask may be a hard mask (e.g., a hard mask of a metal such as Cr), a soft mask of a resist, or a combination thereof. In block 850, a process such as optical lithography, followed by a thinning of the resist 616, may be used to generate a low topography, two-dimensional prepattern 646 in the data zone 614. It should be noted that although a two-dimensional prepattern is provided herein, specific references to a two-dimensional prepattern are for illustrative purposes only and are not intended to be limiting in scope. In some embodiments, for example, the prepattern may be multi-dimensional. Subsequently, DSA of a pattern of block copolymers 652 in the data zone 614, followed by a pattern transfer into the substrate 612 may create a patterned data zone 662.

While a spherical morphology is show in FIG. 6, for example, block copolymers of different morphologies may be used, such as cylindrical or lamellar morphologies. In some embodiments, the pattern of block copolymers 652 may comprise multi-block copolymers wherein each block is either organic (e.g., polystyrene-block-polymethylmethacrylate, polystyrene-block-polyethyleneoxide, polystyrene-block-polyisoprene, and polystyrene-block-polybutadine) or inorganic (e.g., polystyrene-block-polydimethylsiloxane or polystyrene-block-polyferrocenylsilane). In some embodiments, the pattern of block copolymers 652 may comprise the same combination of block copolymers as the forgoing pattern of block copolymers 632. In some embodiments, the pattern of block copolymers 652 may comprise a different combination of block copolymers than the foregoing pattern of block copolymers 632. In block 860, the second protective mask 644 may then be removed to create apparatus 660, which illustrates the fabricated patterned media template with a patterned servo zone 642 and a patterned data zone 662.

In view of the foregoing, provided herein are apparatuses and methods for a data-first overlay and a servo-first overlay. In the servo-first overlay, the step height 747 may be reduced by patterning the data zone after patterning the servo zone, thereby reducing the potential for step-height-related defects.

As such, provided herein is a method comprising forming a first protective mask over a data zone, patterning a first set of features in a servo zone to form a patterned servo zone, removing the first protective mask over the data zone, forming a second protective mask over the patterned servo zone, patterning a second set of features on the data zone, and removing the second protective mask over the patterned servo zone. In some embodiments, the method further comprises transferring a pattern formed by directed self-assembly of block copolymers to a substrate. In some embodiments, the method further comprises thinning a resist while patterning the second set of features. In some embodiments, the method further comprises creating a step height of no more than 15 nanometers above a resist as a result of forming the second protective mask over the patterned servo zone. In some embodiments, forming the first or second protective mask comprises forming the mask with a greater thickness than a resist. In some embodiments, patterning the first set of features comprises patterning features that are about the same height as the bottom of a resist.

Also provided herein is a method comprising patterning a first set of features in a servo zone to form a patterned servo zone, wherein a first mask protects a data zone from the patterning; removing the first mask from the data zone; and patterning a second set of features in the data zone to form a patterned data zone, wherein a second mask protects the patterned servo zone from the patterning. In some embodiments, the patterning of the first set of features or the second set of features comprises transferring a pattern formed by directed self-assembly of block copolymers to a substrate. In some embodiments, the method further comprises forming a resist wherein the resist is thicker than the second mask. In some embodiments, forming the second protective hard mask over the patterned servo zone creates a step height of up to about 30 nanometers above a resist. In some embodiments, the method further comprises forming a two-dimensional guiding pattern in a resist. In some embodiments, the method further comprises patterning features that are about the same height above a bottom of the substrate as a bottom of a resist while patterning the first set of features. In some embodiments, the substrate comprises quartz or silicon.

Also provided herein is an apparatus, comprising a first set of features in a first zone of a substrate, a mask overlying the first zone wherein the mask includes a first height above the substrate, and a second set of features in a resist overlying the second zone of the substrate wherein the resist includes a second height above the substrate, and wherein the first height is greater than the second height. In some embodiments, the apparatus further comprises a third set of features comprising a block copolymer composition self-assembled about the second set of features. In some embodiments, the first height is no more than 30 nanometers greater than the second height above a resist. In some embodiments, the second set of features comprises a multi-dimensional prepattern in the resist. In some embodiments, the mask has a thickness approximately equal to a thickness of the resist. In some embodiments, the first set of features is about the same height above a bottom of the substrate as a bottom of the resist. In some embodiments, the substrate comprises quartz or silicon.

While some particular embodiments have been illustrated and/or described herein, and while the particular embodiments have been illustrated and/or described in some detail, it is not the intention of the applicant(s) for the particular embodiments to limit the scope of the concepts presented herein. Additional adaptations and/or modifications may readily appear to persons having ordinary skill in the art and, in broader aspects, these adaptations and/or modifications may be encompassed as well. Accordingly, departures may be made from the particular embodiments illustrated and/or described herein without departing from the scope of the concepts provided herein. The implementations provided herein and other implementations are within the scope of the following claims.

What is claimed is:

1. A method, comprising:
    forming a first protective mask over a data zone, wherein the data zone includes a resist layer nanoimprinted with guiding patterns;
    patterning a first set of features in a servo zone to form a patterned servo zone, wherein
        patterning the first set of features in the servo zone includes
            forming block copolymers into a pattern on a substrate, and
            etching the pattern into the servo zone of the substrate, and
        the first protective mask protects the data zone while forming and etching the pattern into the servo zone;
    removing the first protective mask over the data zone to expose the resist layer;
    forming a second protective mask over the patterned servo zone;
    patterning a second set of features in the data zone; and
    removing the second protective mask over the patterned servo zone.

2. The method of claim 1, further comprising:
    thinning a resist while patterning the second set of features.

3. The method of claim 1, further comprising:
    creating a step height of no more than 15 nanometers above a resist as a result of forming the second protective mask over the patterned servo zone.

4. The method of claim 1, further comprising:
    wherein forming the first or second protective mask comprises forming the mask with a greater thickness than the resist layer.

5. The method of claim 1,
    wherein patterning the first set of features comprises patterning features that are about the same height as a bottom of the resist layer.

6. A method, comprising:
    patterning a first set of features in a servo zone to form a patterned servo zone, wherein
        a first mask protects a data zone from the patterning, and
        patterning the first set of features in the servo zone includes
            forming block copolymers into a pattern on a substrate, and
            etching the pattern into the servo zone of the substrate;
    removing the first mask from the data zone to expose a resist layer; and
    patterning a second set of features in the data zone to form a patterned data zone,
        wherein a second mask protects the patterned servo zone from the patterning.

7. The method of claim 6, further comprising:
    forming the resist wherein the resist is thicker than the second mask.

8. The method of claim 6,
    wherein forming the second protective mask over the patterned servo zone creates a step height of up to about 30 nanometers above a resist.

9. The method of claim 6, further comprising:
    forming a two-dimensional guiding pattern in the resist.

10. The method of claim 9, further comprising:
    patterning features that are about the same height above a bottom of the substrate as a bottom of a resist while patterning the first set of features.

11. The method of claim 9,
    wherein the substrate comprises quartz or silicon.

* * * * *